United States Patent
Dighde et al.

(10) Patent No.: US 8,712,598 B2
(45) Date of Patent: Apr. 29, 2014

(54) ADAPTIVE FLOW FOR THERMAL COOLING OF DEVICES

(75) Inventors: Rajesh Manohar Dighde, Redmond, WA (US); Bernie Schultz, Bothell, WA (US); David Abzarian, Kenmore, WA (US)

(73) Assignee: Microsoft Corporation, Redmond, WA (US)

( * ) Notice: Subject to any disclaimer, the term of this patent is extended or adjusted under 35 U.S.C. 154(b) by 560 days.

(21) Appl. No.: 13/006,797

(22) Filed: Jan. 14, 2011

(65) Prior Publication Data
US 2012/0182687 A1  Jul. 19, 2012

(51) Int. Cl.
- G05D 23/00 (2006.01)
- H05K 7/20 (2006.01)
- G06F 1/20 (2006.01)
- H01L 23/473 (2006.01)

(52) U.S. Cl.
CPC .............. *G06F 1/206* (2013.01); *H01L 23/473* (2013.01)
USPC ........... 700/300; 700/299; 361/688; 361/694; 361/690; 361/692; 361/704

(58) Field of Classification Search
USPC .......................................... 700/300; 361/692
See application file for complete search history.

(56) References Cited

U.S. PATENT DOCUMENTS

| | | | | |
|---|---|---|---|---|
| 4,722,669 A | * | 2/1988 | Kundert | 417/32 |
| 4,924,937 A | * | 5/1990 | Beal et al. | 165/96 |
| 5,448,143 A | * | 9/1995 | Pecone | 318/434 |
| 5,676,198 A | * | 10/1997 | Schneider et al. | 165/80.3 |
| 5,793,611 A | * | 8/1998 | Nakazato et al. | 361/704 |
| 5,923,262 A | * | 7/1999 | Fuss et al. | 340/684 |
| 5,934,368 A | * | 8/1999 | Tanaka et al. | 165/233 |
| 5,950,714 A | * | 9/1999 | Schneider et al. | 165/80.3 |
| 6,034,872 A | * | 3/2000 | Chrysler et al. | 361/699 |
| 6,184,504 B1 | * | 2/2001 | Cardella | 219/513 |
| 6,212,069 B1 | | 4/2001 | Janik et al. | |
| 6,213,195 B1 | * | 4/2001 | Downing et al. | 165/80.4 |
| 6,319,114 B1 | * | 11/2001 | Nair et al. | 454/184 |
| 6,522,992 B1 | | 2/2003 | McCall et al. | |
| 6,816,371 B2 | | 11/2004 | Agata et al. | |
| 6,934,864 B2 | * | 8/2005 | Chu et al. | 713/324 |
| 6,942,018 B2 | * | 9/2005 | Goodson et al. | 165/80.4 |
| 6,982,873 B2 | * | 1/2006 | Meyer et al. | 361/699 |

(Continued)

FOREIGN PATENT DOCUMENTS

GB       2402205 A    12/2004

OTHER PUBLICATIONS

Marinov, et al., "Determining Angle Position of an Object Using accelerometers", Retrieved at <<http://ecad.tu-sofia.bg/et/2005/pdf/Paper126-M_Marinov.pdf>>, Electronics, vol. 3, Sep. 21-23, 2005, pp. 184-189.

*Primary Examiner* — Mohammad Ali
*Assistant Examiner* — Kelvin Booker
(74) *Attorney, Agent, or Firm* — Jeremy Snodgrass; Glen Johnson; Micky Minhas

(57) ABSTRACT

A method for cooling an electronic device having first and second flow paths for transmitting a coolant. The method includes assessing a merit of impelling the coolant along the first flow path relative to impelling the coolant along the second flow path. When the relative merit is above a threshold, coolant is impelled along the first flow path. When the relative merit is below the threshold, coolant is impelled along the second flow path.

18 Claims, 10 Drawing Sheets

(56) References Cited

U.S. PATENT DOCUMENTS

| | | | |
|---|---|---|---|
| 7,134,486 B2* | 11/2006 | Santiago et al. | 165/104.28 |
| 7,187,548 B2* | 3/2007 | Meyer et al. | 361/699 |
| 7,203,062 B2 | 4/2007 | Tsuji | |
| 7,312,992 B2* | 12/2007 | Jory et al. | 361/696 |
| 7,525,798 B2* | 4/2009 | Schultz et al. | 361/688 |
| 7,527,409 B2 | 5/2009 | Atarashi et al. | |
| 7,726,186 B2* | 6/2010 | Nair | 73/204.25 |
| 7,903,409 B2* | 3/2011 | Patel et al. | 361/700 |
| 8,059,405 B2* | 11/2011 | Campbell et al. | 361/700 |
| 8,164,434 B2* | 4/2012 | Gross et al. | 340/501 |
| 8,274,228 B2* | 9/2012 | MacDonald et al. | 315/111.91 |
| 8,305,728 B2* | 11/2012 | Lee et al. | 361/231 |
| 8,315,746 B2* | 11/2012 | Cox et al. | 700/299 |
| 8,395,898 B1* | 3/2013 | Chamseddine et al. | 361/700 |
| 2003/0133259 A1* | 7/2003 | Meyer et al. | 361/677 |
| 2003/0151893 A1* | 8/2003 | Meyer et al. | 361/688 |
| 2004/0262409 A1* | 12/2004 | Crippen et al. | 236/49.3 |
| 2005/0209740 A1* | 9/2005 | Vann | 700/300 |
| 2006/0113066 A1* | 6/2006 | Mongia et al. | 165/104.33 |
| 2006/0114652 A1* | 6/2006 | Jory et al. | 361/694 |
| 2007/0268667 A1 | 11/2007 | Moorer et al. | |
| 2008/0060794 A1* | 3/2008 | Wei | 165/109.1 |
| 2008/0192428 A1* | 8/2008 | Clayton et al. | 361/687 |
| 2008/0198896 A1* | 8/2008 | Nair | 374/141 |
| 2008/0269954 A1* | 10/2008 | Lev et al. | 700/299 |
| 2008/0313492 A1* | 12/2008 | Hansen | 714/5 |
| 2009/0021908 A1* | 1/2009 | Patel et al. | 361/688 |
| 2009/0316103 A1 | 12/2009 | Nose et al. | |
| 2009/0321044 A1* | 12/2009 | Hernon et al. | 165/80.2 |
| 2011/0079376 A1* | 4/2011 | Loong et al. | 165/185 |
| 2011/0116206 A1* | 5/2011 | Kim | 361/231 |
| 2011/0139401 A1* | 6/2011 | Huang et al. | 165/96 |
| 2011/0157813 A1* | 6/2011 | MacDonald et al. | 361/679.46 |
| 2011/0292560 A1* | 12/2011 | Jewell-Larsen et al. | 361/231 |
| 2012/0002342 A1* | 1/2012 | Lee et al. | 361/231 |
| 2012/0026692 A1* | 2/2012 | Loong et al. | 361/702 |
| 2012/0111027 A1* | 5/2012 | Campbell et al. | 62/3.3 |
| 2012/0111034 A1* | 5/2012 | Campbell et al. | 62/113 |
| 2012/0120542 A1* | 5/2012 | Zhang et al. | 361/230 |
| 2012/0162903 A1* | 6/2012 | MacDonald et al. | 361/679.46 |
| 2012/0175663 A1* | 7/2012 | Lee | 257/99 |
| 2012/0205079 A1* | 8/2012 | Jewell-Larsen et al. | 165/104.34 |
| 2012/0268857 A1* | 10/2012 | Jewell-Larsen | 361/231 |
| 2013/0021750 A1* | 1/2013 | Senatori | 361/695 |

* cited by examiner

ADAPTIVE FLOW FOR THERMAL COOLING OF DEVICES

BACKGROUND

Heat released by the circuitry of an electronic device may be dissipated in various ways. Often a coolant, such as air, is used to carry away excess heat so that the circuitry stays within a suitable range of temperatures. To facilitate the exchange of heat to the coolant, pumps, vents, fans, or the like may be arranged within the electronic device; such components may conduct the coolant along a fixed flow path. The flow path may be engineered to provide thermal coupling between the coolant and the heat-releasing circuitry during predefined usage scenarios of the electronic device.

SUMMARY

One embodiment of this disclosure provides a method for cooling an electronic device having first and second flow paths for transmitting a coolant. The method includes assessing a merit of impelling the coolant along the first flow path relative to impelling the coolant along the second flow path. When the relative merit is above a threshold, coolant is impelled along the first flow path. When the relative merit is below the threshold, coolant is impelled along the second flow path.

The summary above is provided to introduce a selected part of this disclosure in simplified form, not to identify key or essential features. The claimed subject matter, defined by the claims, is limited neither to the content of this summary nor to implementations that address problems or disadvantages noted herein.

DETAILED DESCRIPTION

Figure 1:
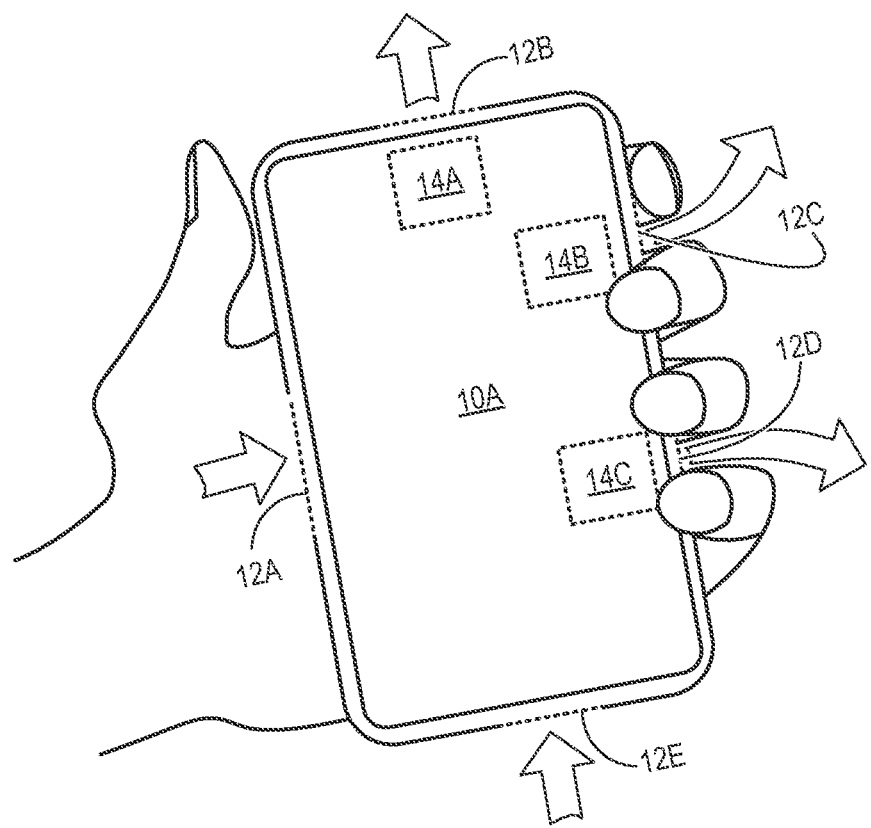
FIGS. 1 and 2 shows aspects of an example electronic device in accordance with an embodiment of this disclosure.

Aspects of this disclosure will now be described by example and with reference to the illustrated embodiments listed above. Components, process steps, and other elements that may be substantially the same in one or more embodiments are identified coordinately and are described with minimal repetition. It will be noted, however, that elements identified coordinately may also differ to some degree. It will be further noted that the drawing figures included in this disclosure are schematic and generally not drawn to scale. Rather, the various drawing scales, aspect ratios, and numbers of components shown in the figures may be purposely distorted to make certain features or relationships easier to see.

FIG. 1 shows aspects of an electronic device 10A in one embodiment. The device may be a cellular telephone, a personal media player, a game system, and/or a navigation device, for example. As such, the device may include electronic circuitry—e.g. one or more batteries, displays, processors, etc.—which release heat. In this disclosure, the term 'heater' is applied to any such circuitry and to the electronic components thereof.

To cool the circuitry of electronic device 10A, a coolant such as air may be admitted to the device through one or more vents—e.g., vents 12A and 12E in FIG. 1. This coolant, heated by the various heaters within the device, may be discharged from the device, again through the one or more vents. In the embodiment shown in FIG. 1, vents 12B-D discharge the heated coolant. In some embodiments, some of the vents may be inlet vents configured to admit the coolant; others may be outlet vents configured to discharge the heated coolant. In other embodiments, at least one of the vents may admit coolant during a first operating condition and discharge heated coolant during a second operating condition. In some embodiments, at least one vent may be covered by a screen or filter to prevent ingress of coolant-borne dust, and the like, into the electronic device. Further, at least one vent may be coupled to a silencer configured to dampen the sound caused by the flow of coolant through the vent.

Continuing in FIG. 1, electronic device 10A includes a plurality of flow controllers 14A-C arranged inside the device. In this disclosure, the term 'flow controller' is applied to virtually any mechanism coupled fluidically between an inlet vent and an outlet vent and configured to control the flow of coolant therebetween. Two example kinds of flow controllers include flow impellers—e.g., fans, pumps, and the like; and flow restrictors—e.g., electrically actuable baffles, valves, irises, and the like. A flow controller of the flow-impeller kind may be configured to control coolant flow by impelling coolant in a forward direction, by impelling coolant in a reverse direction, and/or by varying the velocity at which the coolant is impelled. A flow controller of the flow-restrictor kind may be configured to control coolant flow by offering a fixed or variable restriction to coolant flow. Meanwhile, the mode of flow control effected by a given flow controller at a given time—forward or reverse, fast or slow, great or small restriction, etc.—may be determined via one or more control signals that the flow controller receives. Such control signals may be sent to the one or more flow controllers from an electronic control system coupled within the device (vide infra). In this manner, the flow controllers may be used to control coolant flow between and among the various vents of the electronic device.

With respect to the kinds of flow controllers an electronic device may include, it will be noted that some devices may include flow impellers, but no flow restrictors. Others may include both kinds of flow controllers, while still others may have essentially passive cooling systems, where coolant flows only by convection, conduction, and radiation. Even there, an enhanced cooling strategy may be effected via judicious placement of one or more flow restrictors, which select from among one or more passive coolant flow paths (vide infra).

Flow controllers 14A, 14B, and 14C, in FIG. 1, are positioned adjacent outlet vents 12B, 12C, and 12D, respectively. In this example, the flow controllers may be small, electric fans arranged to draw heated coolant out of device 10A through the adjacent outlet vents. In other embodiments, such fans may be positioned adjacent the inlet vents and configured to impel coolant into device 10A. In still other embodiments, one or more flow controllers may be arranged in a more central location of the device—e.g., midway between an inlet vent and an outlet vent. For example, a coolant-guiding conduit or system of conduits may be arranged inside the device and configured to confine the coolant to one or more flow paths linking the various vents and flow controllers. In other examples, the native internal structure of the electronic device—internal components, housing, etc.—may serve as a conduit system.

Figure 2:
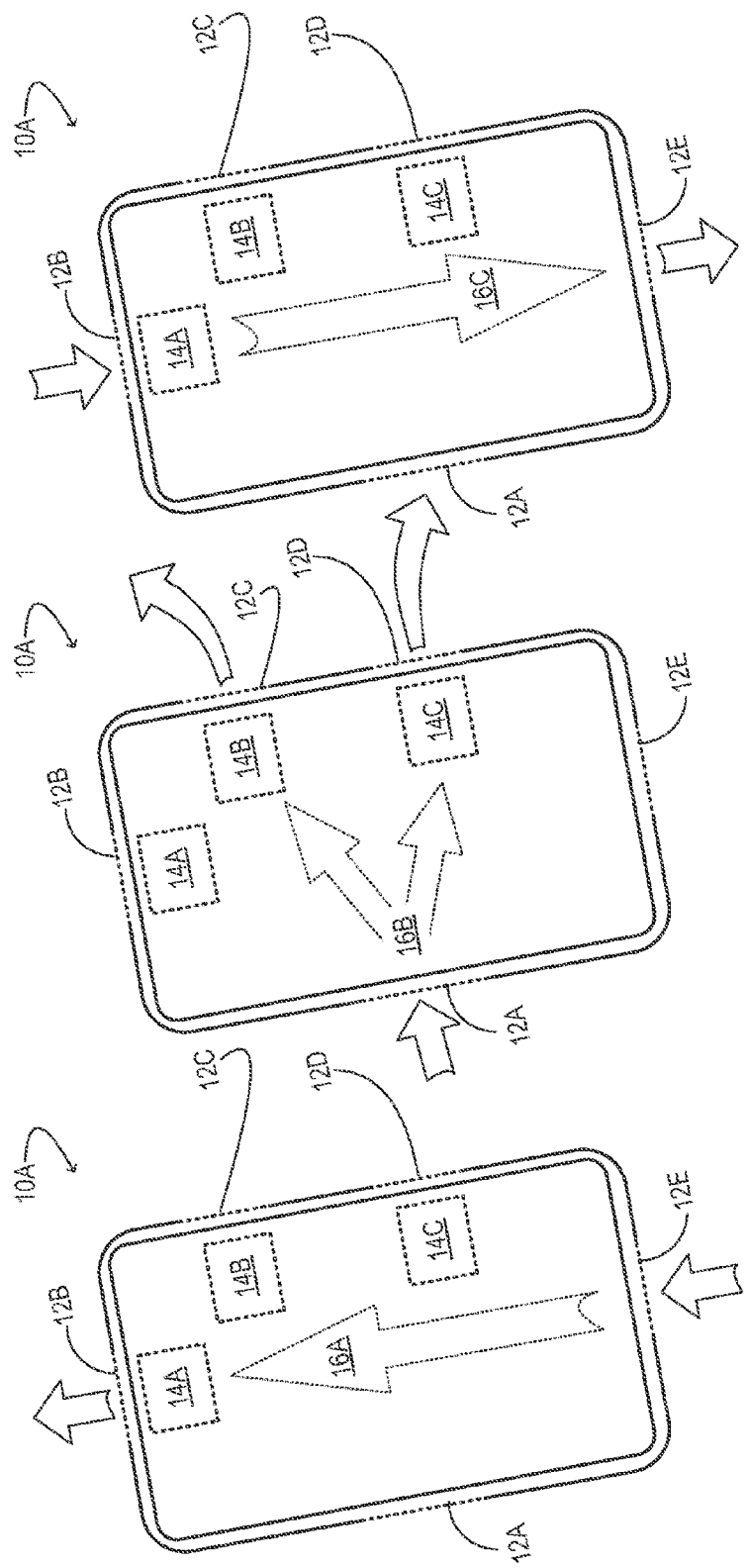

FIG. 2 shows three additional views of electronic device 10A, which schematically illustrate coolant flow paths 16A, 16B, and 16C. More generally, an electronic device may include a plurality of internal coolant flow paths for transmitting a coolant. Each coolant flow path may include one or more inlet vents for admitting the coolant and one or more outlet vents for discharging the coolant. Further, one or more flow controllers may be coupled fluidically in each of the coolant flow paths, as shown in the drawing. It will be understood that the term 'flow path', as used herein, defines not only an area through which the coolant flows but also a direction of the flow. Thus, in FIG. 2, flow paths 16A and 16C are distinct from each other, even though they share the same flow area. In this example, the coolant may flow along flow path 16A when flow controller 14A is actuated in a forward direction, and along flow path 16C when the flow controller is actuated in a reverse direction.

When an electronic device is to be mounted or held in a predictable orientation, it may be possible to ensure, at design time, that coolant flowing along a fixed flow path will adequately cool the circuitry of the device. However, with devices that may be mounted or held in variable orientations, this approach may not provide adequate cooling over the full range of usage scenarios.

From FIG. 1 it will be appreciated that electronic device 10A may be held in a user's hand and in a number of different orientations. It may be held vertically or horizontally, gripped in the palm or by the fingers, for instance. Depending on how the user grips the device, one or more vents 12A-E may be blocked by the user's hand, such that the coolant cannot flow along the intended path despite the action of the flow controllers. Furthermore, the user that places a hand over an outlet vent through which heated coolant is discharged may experience discomfort. Although FIG. 1 shows electronic device 10A being gripped by one hand, some electronic devices—slate or tablet computers, for example—may be gripped by both hands, presenting further issues with respect to coolant flow.

Figure 3:
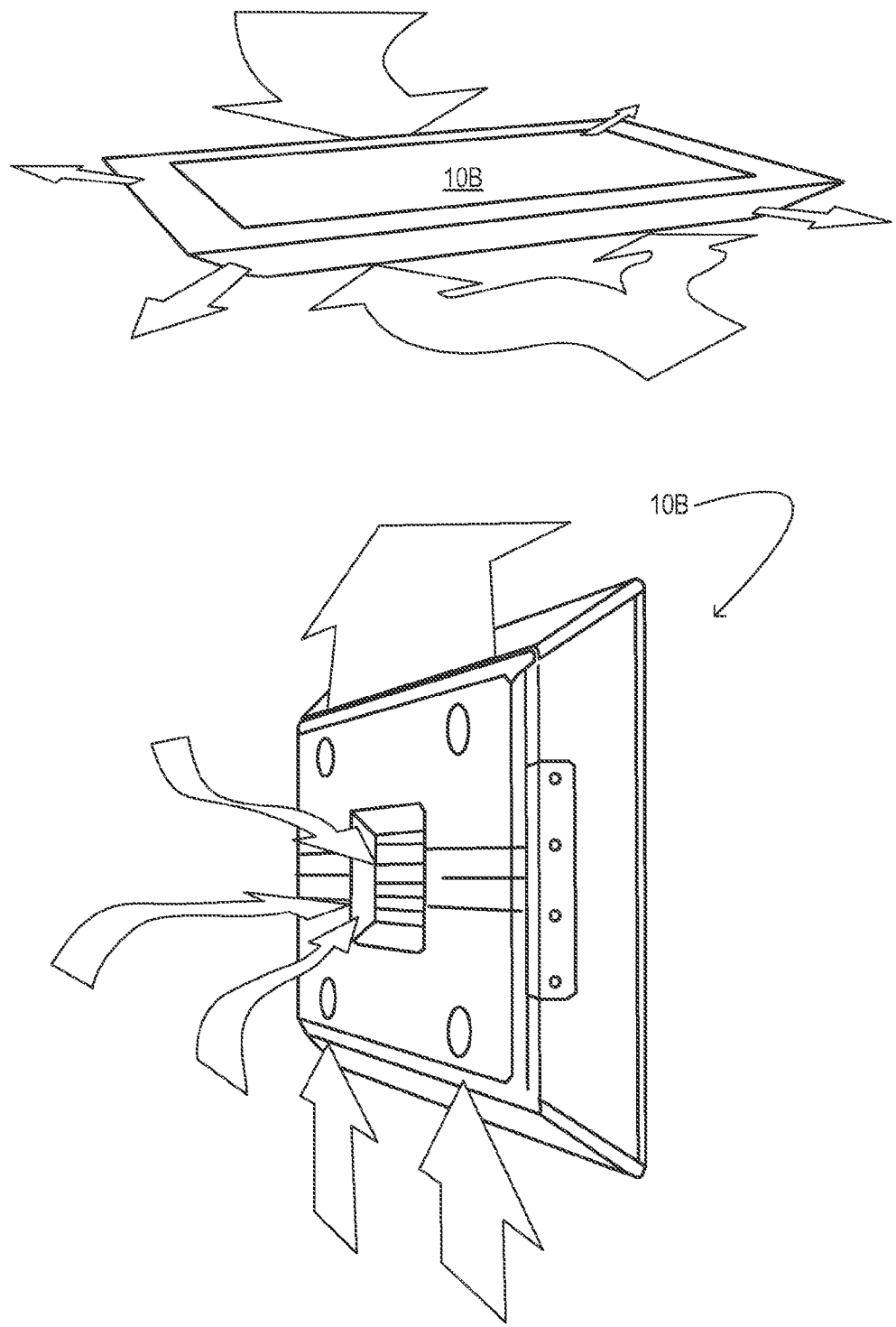
FIGS. 3 through 7 show aspects of other example electronic devices in accordance with embodiments of this disclosure.
Figure 4:
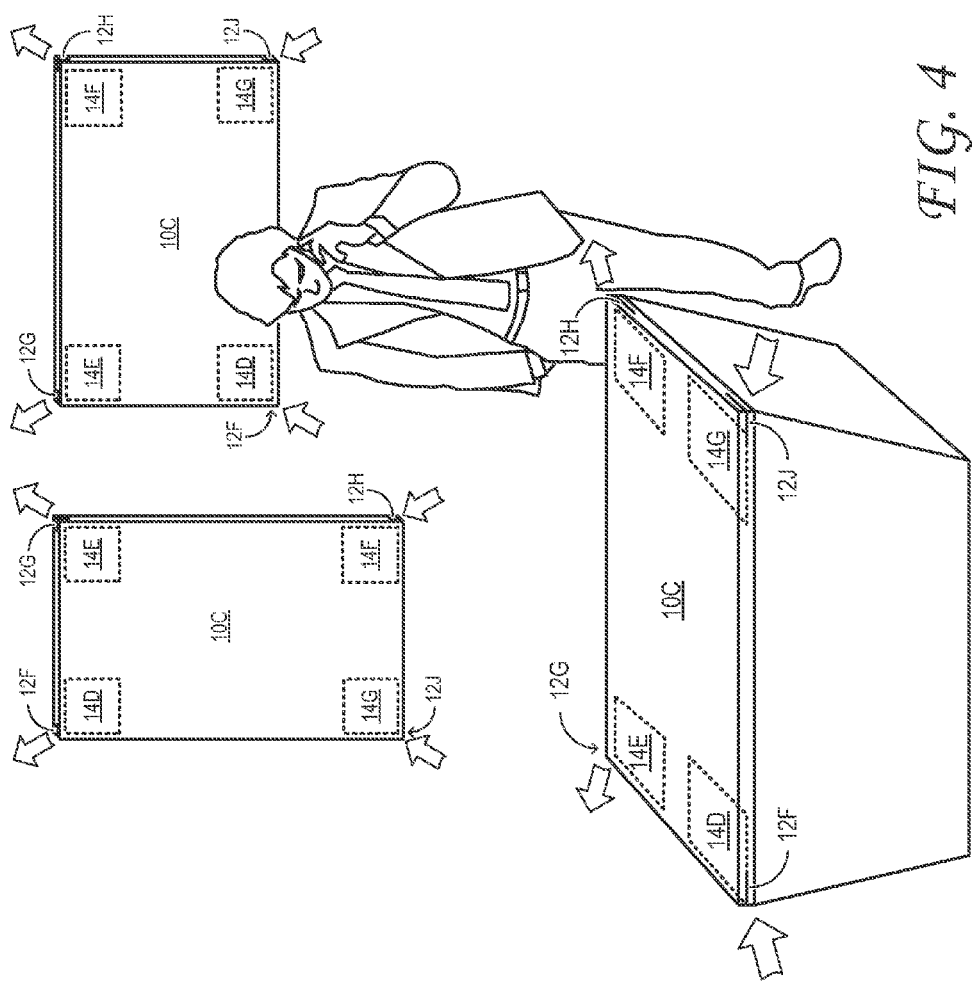

These and other issues arise with relatively large-format display devices, including interactive (e.g., touch-sensitive or multi-touch) display devices. FIGS. 3 and 4 show aspects of example display devices that may be mounted horizontally to a table, vertically to a wall, or inclined obliquely. Further, with any non-horizontal mounting, the devices may be oriented panoramically or rotated into various physically distinct orientations, including a portrait orientation. When mounted vertically, the devices may be cooled efficiently by drawing coolant into bottom edge or corner vents and discharging the more buoyant, heated coolant from the top vents. For display devices that also include a rear vent, such as device 10B of FIG. 3, the increased buoyancy of the heated coolant may be used to an advantage even when the device is mounted horizontally.

With other devices—e.g., very thin devices or those lacking a rear vent—the buoyancy of the heated coolant may not determine the most effective coolant flow path for horizontal mounting. Rather, a more relevant issue may be the location of various obstacles—including users—around the perimeter of the device. For more efficient cooling, coolant should be admitted to and discharged from areas where the obstacles are sparse. Moreover, to provide a more positive user experience, when possible, air should not be discharged in the direction of the users, nor at eye-level to the users.

Figure 5:
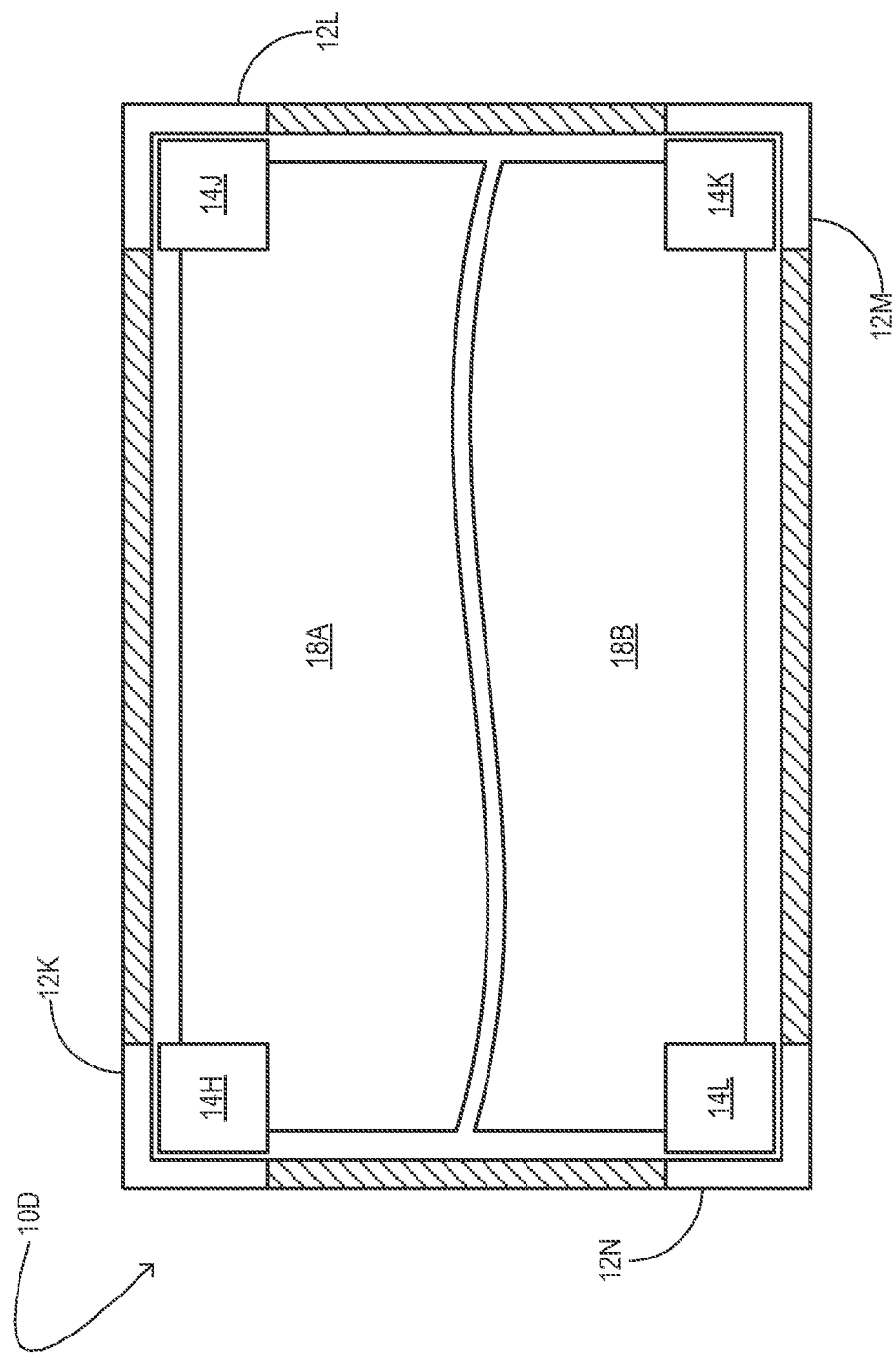

FIG. 5 shows aspects of another electronic device 10D in one embodiment. In addition to vents 12K-N and flow controllers 14H-L, the drawing also shows spatially separated heaters 18A and 18B. These heaters may correspond to different processors, different radio transceivers, different regions of a display screen, etc., or to any spatially segregated grouping of electronic circuits or components, irrespective of function.

Figure 6:
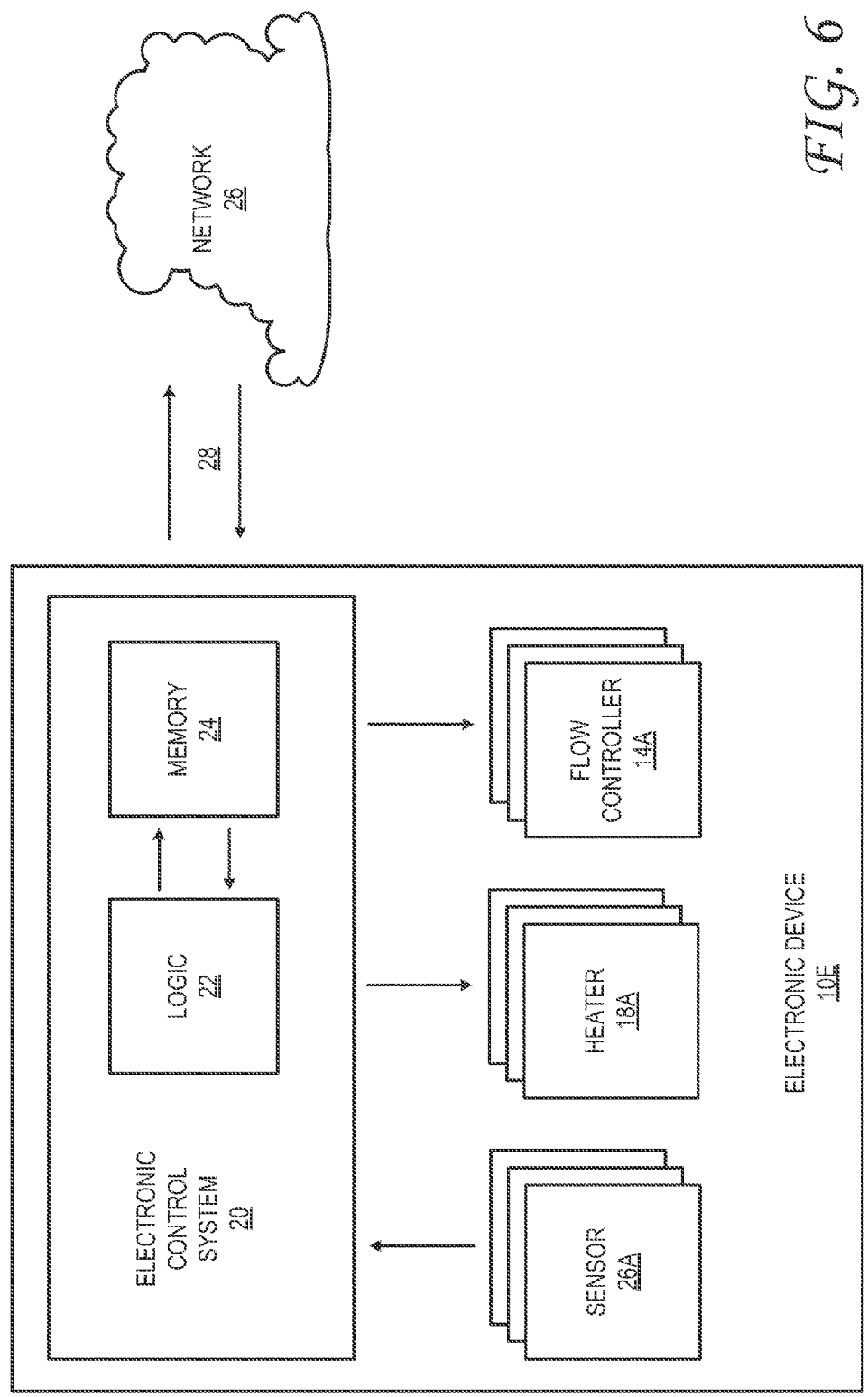

To enable intelligent thermal management for the electronic devices disclosed herein, each device may include an electronic control system. FIG. 6 shows an example electronic control system 20A in one embodiment. Coupled within electronic device 10E, the electronic control system includes logic subsystem 22 and memory subsystem 24, further described hereinafter. In one embodiment, the electronic control system may be engineered into the firmware of one or more components or subsystems of the electronic device. In other embodiments, the electronic control system may include software executed by programmable hardware. In still other embodiments, some aspects of the electronic control system may be instantiated in firmware, and others in software.

In FIG. 6, electronic control system 20A is configured to exchange information with network 26 through communications link 28. In one embodiment, the network may comprise the internet. In other embodiments, the network may comprise a cellular network, a cable network, or virtually any wired or wireless communications network.

As shown in FIG. 6, electronic control system 20A is operatively coupled to the various heaters of electronic device 10E—heater 18A, etc.—and to flow controllers 14A, etc. Accordingly, the electronic control system is configured to exert control over the one or more heaters and the one or more flow controllers by applying power and other control signals thereto.

FIG. 6 also shows an array of sensors (sensor 30A, for example) operatively coupled to electronic control system 20A. Each sensor furnishes an output signal responsive to an operating condition of electronic device 10E to the electronic control system.

In one embodiment, sensor 30A may be a temperature sensor. One or more such sensors may be arranged close to, or in thermal contact with the one or more heaters of the device. Accordingly, the temperature sensor may be used to assess the operating temperature of a heater. By receiving an output from this sensor, electronic control system 20A may determine whether the heater is operating within, or above, an acceptable temperature range.

In another embodiment, sensor 30A may be a coolant-pressure sensor, such as an air-pressure sensor. The sensor may be coupled in the device and configured to determine whether an inlet or outlet vent of an active flow path is blocked. For example, coolant (e.g., air) pressure above a predetermined threshold may indicate that an outlet vent is blocked as coolant continues to be drawn through an unblocked inlet vent of the same flow path. Conversely, coolant pressure below a predetermined threshold may indicate that an inlet vent is blocked as heated coolant continues to be discharged through an unblocked outlet vent of the same flow path.

This feature may be especially useful when the electronic device is mounted to a wall, using VESA mounts, where there may be insufficient clearance from the wall for the exhaust air to be adequately vented. A similar issue arises with portable devices that may be set on a substantially horizontal surface, such as a table, desk, or lap pad. In some scenarios, the surface may enable sufficient venting from the bottom surface, while in other scenarios it may not. In one embodiment, appropriate sensors coupled to the vents on the bottom surface of the device may assess the efficacy of cooling through the bottom-surface vents. If the cooling is inadequate, side-vents—for example—may be used instead of, or in addition to, the bottom vents.

In another embodiment, sensor 30A may be a sound sensor configured to detect sound and/or sound pressure due to the operation of one or more fans or pumps. Excessive sound from one region of the electronic device may be used as an indication that one or more fans or pumps in that region are being overworked in a currently active coolant flow path. In some scenarios, switching to a different coolant flow path may effect a suitable level of cooling, but operate fewer fans, or operate them less frequently. Accordingly, the coolant flow path activated in the electronic device may be adjusted so as to minimize the amount of sound generated, while maintaining desired operating temperatures.

In other embodiments, sensor 30A may be configured to directly interrogate the manner in which one or more users are interacting with electronic device 10E. For example, the sensor may be an ambient light sensor or other suitable proximity sensor. One or more such sensors may be arranged around the perimeter of the device to detect the presence of various obstacles—users, objects, fingers, etc.—that may impede coolant flow to or from the various vents of the device.

In another embodiment, sensor 30A may be a contact pressure sensor. One or more such sensors may be arranged around the perimeter of device 10E to detect locations where a user may be gripping the device.

In another embodiment, sensor 30A may be an accelerometer. This sensor may be coupled within electronic device 10E and configured to sense the direction of the local gravitational force. From this information, and based on the known orientation in which the accelerometer is coupled in the device, electronic control system 20A may be configured to determine the mounting orientation of the device. In other embodiments, an inclinometer different from an accelerometer may be coupled within and used to determine the mounting orientation of the electronic device.

In other embodiments, sensor 30A may not be a sensor per se but a component of electronic device 10E that inherently furnishes an output responsive to coolant-flow conditions in the device. For example, a flow controller such as a fan may be driven by an electric motor; the impedance of the motor may inherently respond to load, and therefore, to coolant-flow conditions. Accordingly, the degree to which a vent in the electronic device is blocked may be revealed by the amount of current drawn through the motor at a constant applied voltage. Various other parameters responsive to load—the temperature of the fan, the level of noise emitted by the fan, etc.—may also be sensed and used to assess coolant-flow conditions.

In other embodiments, sensor 30A may be a subsystem of electronic device 10. For example, the sensor may be a global-positioning system (GPS) coupled within the device. Received in electronic control system 20A, the output of the GPS may be used natively to discover various aspects of the local environment in which the device is being used. In one example, the GPS output may be used to infer how dusty the environment may be, to estimate a range of temperatures of the ambient air surrounding the device, or to determine the relative buoyancy of air of various temperatures, etc.

In other embodiments, the GPS output may be used in conjunction with network 26. Based on the GPS output, for example, electronic control system 20A may determine the longitude, latitude, and altitude where electronic device 10E is being used. Via the network, it may determine various other environmental conditions—ambient temperature, ambient humidity, etc.—at the geographic location of the device. Based on the environmental conditions learned from the network, the electronic control system may determine how to actuate each flow controller and/or heater to provide the most appropriate mode of cooling.

In another embodiment, a plurality of electronic devices may be installed adjacent each other—in a tiled installation, for example. The proximity of the devices with respect to each other may influence the most appropriate cooling strategy for each device. Situations to be avoided may include, as examples, having an outlet vent of one device adjacent an inlet vent of another, or in general, having any active vent blocked by another device. On the other hand, the presence of an adjacent device may be 'good news' in some cases, indicating that no user or other obstacle can be positioned between the devices to block air flow.

In these varied scenarios, GPS in combination with network access may enable a given device in the installation to sense its relative position with respect to the others. Accordingly, electronic control system 20A may be configured to control the various flow controllers to effect the best cooling mode in view of the relative position.

In another embodiment, sensor 30A may be a touch-input subsystem of electronic device 10. The output signal furnished by the sensor may indicate touch of a particular kind, distinguishing the usage mode of the electronic device from among a plurality of usage modes. For example, repeated virtual-keypad touches at a long edge of the device may indicate that the device is being used in a panoramic orientation, while repeated virtual-keypad touches at a short edge of the device may indicate that the device is being used in a portrait orientation. As another example, the position and/or orientation of one or more user digits detected by a touch screen of the device may be analyzed to determine an orientation of the device. For example, thumbs detected on the long edge of the touch screen may indicate that the device is being used in a panoramic orientation; thumbs detected on the short edge of the touch screen may indicate that the device is being used in a portrait orientation.

Figure 7:
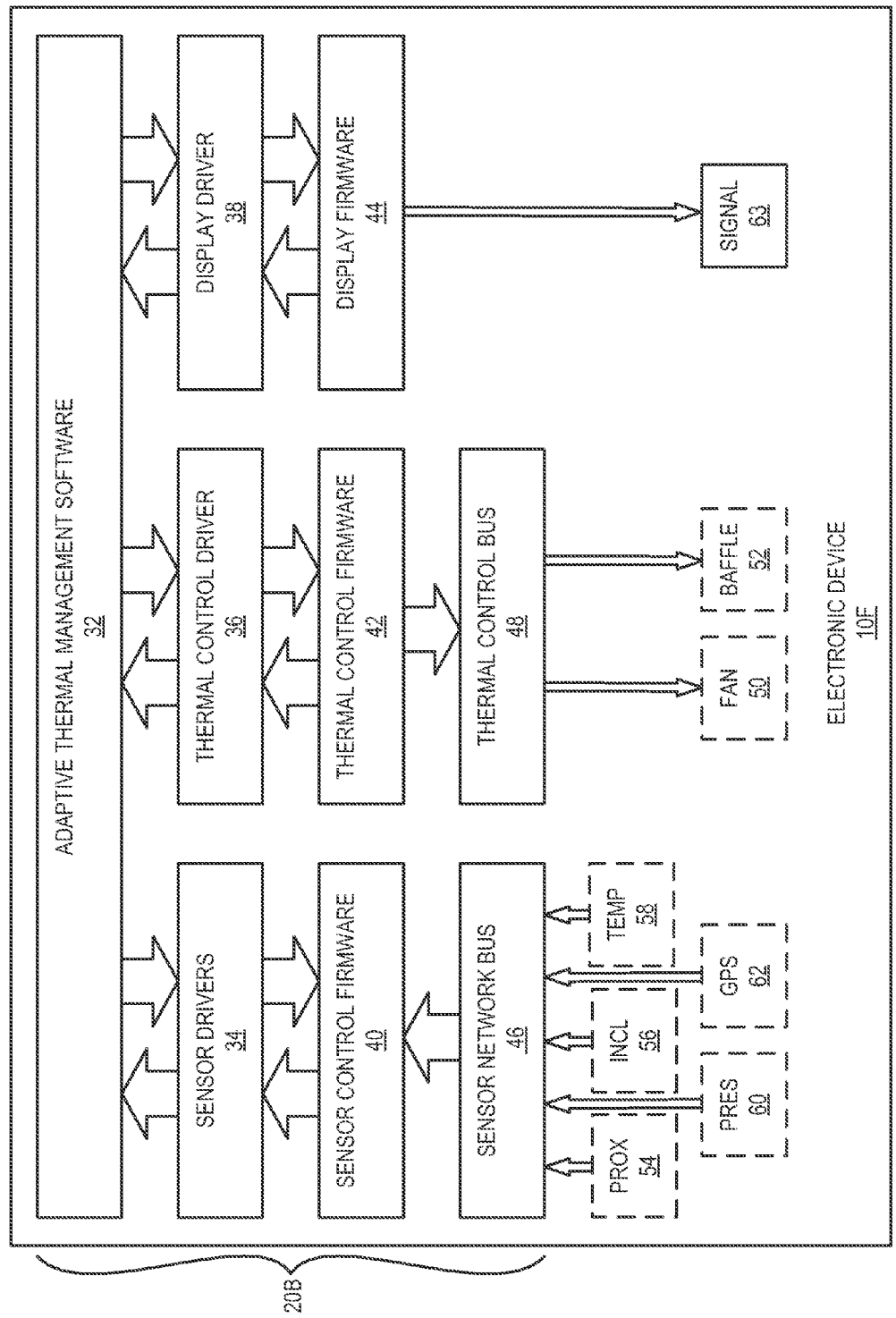

FIG. 7 shows aspects of another electronic control system 20B coupled within electronic device 10F. In this system, adaptive thermal management software 32 enacts an overall thermal-management strategy, as described herein. To this end, the adaptive thermal management software exchanges data and control signals with three driver modules: sensor driver module 34, thermal control driver module 36, and display driver 38. Each of the driver modules exchanges data and control signals with the appropriate firmware of the electronic control system: sensor driver module exchanges data and control signals with sensor control firmware 40; thermal control driver module with thermal control firmware 42; and the display driver module with display firmware 44.

Further, sensor control firmware 40 receives data from sensor network bus 46, while thermal control firmware 42 furnishes the appropriate control signals to thermal control bus 48. The thermal control bus, in turn, actuates the various flow controllers of electronic device 10F, which may include at least one fan 50 and/or movable baffle 52. The sensor bus receives and coordinates sensor output from the various sensors of the electronic device. Such sensors may include at least one proximity sensor 54, at least one inclinometer 56, at least one temperature sensor 58, at least one pressure sensor 60, and/or a GPS 62.

In the embodiment shown in FIG. 7, display firmware 44 is configured to cause a signal 63 to be displayed. The signal may report to the user some aspect of the adaptive thermal management strategy being enacted. For example, the signal may report which of several coolant flow paths is currently active, the overall efficacy of device cooling, etc. Informed in this manner, the user may take further actions to improve cooling—such as to mount or orient the device differently, remove obstacles to coolant flow, reduce power, and so on.

Although the embodiments described above show ambient air being used as the coolant, other coolants may be appropriate in some circumstances. Such other coolants may include refrigerated air, water, or a suitable refrigerant.

The configurations described above enable various methods for cooling an electronic device such that the various thermal inputs and outputs of the device are intelligently managed. Benefits of this approach include increased device longevity, reduced power consumption, smooth operation, and keen attention to the user's comfort and safety. Some such methods are now described, by way of example, with continued reference to the above configurations. It will be understood, however, that the methods here described, and others fully within the scope of this disclosure, may be enabled by other configurations as well. Naturally, some of the process steps described and/or illustrated herein may, in some embodiments, be omitted without departing from the scope of this disclosure. Likewise, the indicated sequence of the process steps may not always be required to achieve the intended results, but is provided for ease of illustration and description. Rather, one or more of the illustrated actions, functions, or operations may be performed repeatedly, depending on the particular strategy being used.

Figure 8:
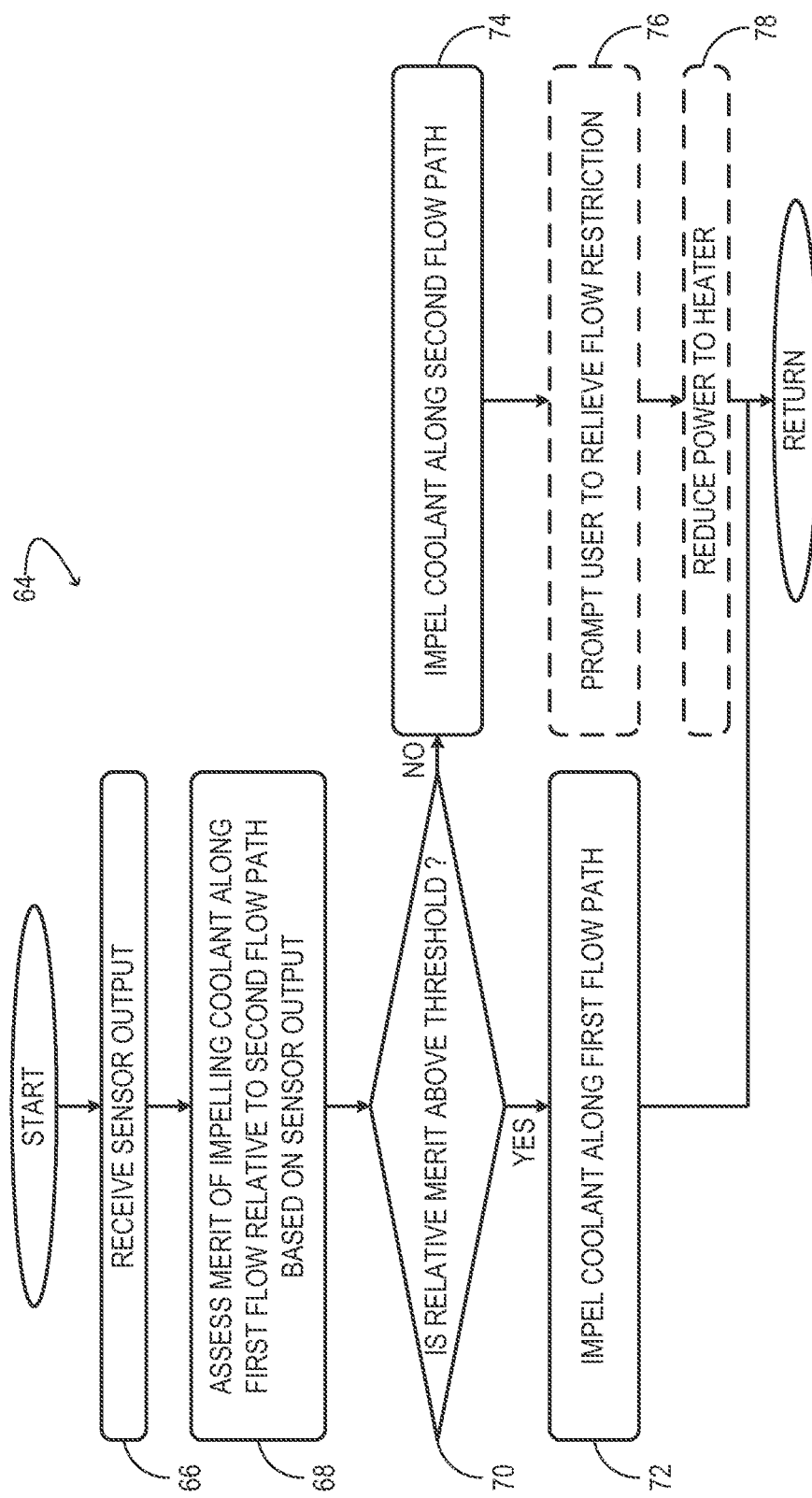
FIG. 8 illustrates an example method for cooling an electronic device in accordance with an embodiment of this disclosure.

FIG. 8 shows an example method 64 for cooling an electronic device. The device may include various inlet and outlet vents and various flow controllers fluidically coupled in two or more distinct flow paths. For purposes of illustration, the method refers, generally, to a first and second flow path. It will be understood, however, that methods involving a greater number of flow paths are fully embraced by this disclosure.

At 66 of method 64, a sensor output is received in an electronic control system of the device. The output may be that of a temperature sensor, a coolant-pressure sensor, a proximity sensor, or a contact sensor, for example. In other embodiments, the output may be received from a GPS. In one embodiment, the output received may distinguish an orientation of the electronic device—e.g. a horizontal orientation or a vertical or oblique orientation.

At 68 the merit of impelling coolant along a first flow path relative to impelling coolant along a second flow path is assessed. In the illustrated embodiment, the relative merit is assessed based on the output received from the one or more sensors. For instance, the relative merit may increase or decrease numerically (e.g., proportionally) with an increasing sensor output, such as an output responsive to temperature or pressure. Suppose, for example, that a temperature sensor is coupled to a heater arranged in the first flow path. When the first flow path is active, a heater temperature increasing above a threshold may signal that an inlet or outlet vent of the first flow path is blocked. Therefore, the electronic control system may compute a lower merit of impelling coolant along that flow path, relative to impelling along a second flow path. In another example, suppose that an air-pressure sensor is arranged in the first flow path. When the first flow path is active, pressure increasing above a first threshold may signal that an outlet vent of the first flow path is blocked. Conversely, pressure decreasing below a second threshold may signal that an inlet vent of the first flow path is blocked. In either case, the electronic control system may therefore compute a lower merit of impelling coolant along that flow path, relative to impelling along a second flow path.

In some cases, the output of two or more different sensors may contribute to the relative merit. Here, the outputs may contribute constructively—e.g., the relative merit may increase when either of two outputs increases—or the two outputs may have an opposing effect on the relative merit. In one embodiment, the relative merit may be computed as a binary figure of merit (0 or 1). In this and other embodiments, a fuzzy-logic approach may be used to merge the outputs of a plurality of sensors into the figure of relative merit used for further processing.

In one embodiment, the actions taken at 68 may include correlating the orientation of the device determined from the sensor output to a merit of impelling the coolant along the first flow path relative to impelling the coolant along the second flow path. Turning back to FIG. 4, we consider a scenario in which the first flow path draws coolant into vents 12J and 12H and out of vents 12F and 12G, and in which the second flow path transmits coolant in the opposite direction. When the electronic device is mounted horizontally, the relative merit of impelling coolant through the first and second flow paths may be equal. However, when the electronic device is mounted vertically in the portrait orientation, the relative merit of the impelling along the first flow path will be greater, because this flow path takes full advantage of the temperature-induced buoyancy increase of the coolant.

In another embodiment, assessing the relative merit comprises computing a lower relative merit when the inlet or outlet vent of the first flow path is obstructed. For example, the relative merit may be reduced when the user's hand is blocking the inlet vent or the outlet vent. To this end, the relative merit may be computed based on an output of one or more proximity sensors or contact pressure sensors. For example, the relative merit may decrease with increasing response from a proximity sensor adjacent an inlet or outlet vent of the first flow path; it may increase with increasing response from a proximity sensor adjacent an inlet or outlet vent of the second flow path. In another embodiment, assessing the relative merit comprises computing a lower relative merit when a buoyancy of the coolant opposes a flow of the coolant along the first flow path. This may occur, for example, when the electronic device is mounted or held vertically, and the inlet vent of the first flow path is above the outlet vent, contrary to the vertical orientations of FIG. 4. In yet another embodiment, assessing the relative merit comprises computing a lower relative merit when a user of the device is seated or standing opposite an outlet vent of the first flow path. Such information may be gathered by one or more proximity centers arranged around the perimeter of the device, for example.

Returning now to FIG. 8, at 70 it is determined whether the relative merit is above a threshold. If the relative merit is above the threshold, then the method advances to 72. However, if the relative merit is not above the threshold, then the method advances to 74. At 72 coolant is impelled along the first flow path. In one embodiment, impelling the coolant along the first flow path comprises forwardly actuating a flow controller coupled fluidically between an inlet and outlet vent of the first flow path.

At 74 coolant is impelled along the second flow path. In one embodiment, impelling the coolant along the second flow path comprises reversedly actuating the first flow controller referred to above. In another embodiment, impelling the coolant along the second flow path comprises actuating a second flow controller fluidically coupled to an inlet vent different than the inlet vent of the first flow path or to an outlet vent different than the outlet vent of the first flow path.

FIG. 8 further illustrates certain optional actions that may be taken by an electronic control system in some embodiments, but omitted in others. At 76, for example, the user of the electronic device may be prompted to relieve a flow restriction at an inlet or outlet vent of the first flow path after it has been determined that the relative merit of impelling the coolant along the first flow path has dropped below the predetermined threshold. In this manner, the user of the device may participate in lessening the resistance to coolant flow, to make that coolant flow path more efficacious.

At 78 power to one or more heaters arranged in the first flow path is reduced. This action may be taken, for example, once it has been determined that an inlet or outlet vent of the first coolant flow path is obstructed or opposes the natural buoyancy-induced coolant flow, or has a low relative merit for other reasons as disclosed herein. For the electronic device illustrated in FIG. 5, for example, heater 18A may be deactivated when the computed merit of impelling coolant from vent 12K to vent 12L drops below a threshold. Thus, the power applied to a heater coupled fluidically between the inlet vent and the outlet vent may be reduced when the relative merit is below the threshold. From 72 or 78, the method returns.

Figure 9:
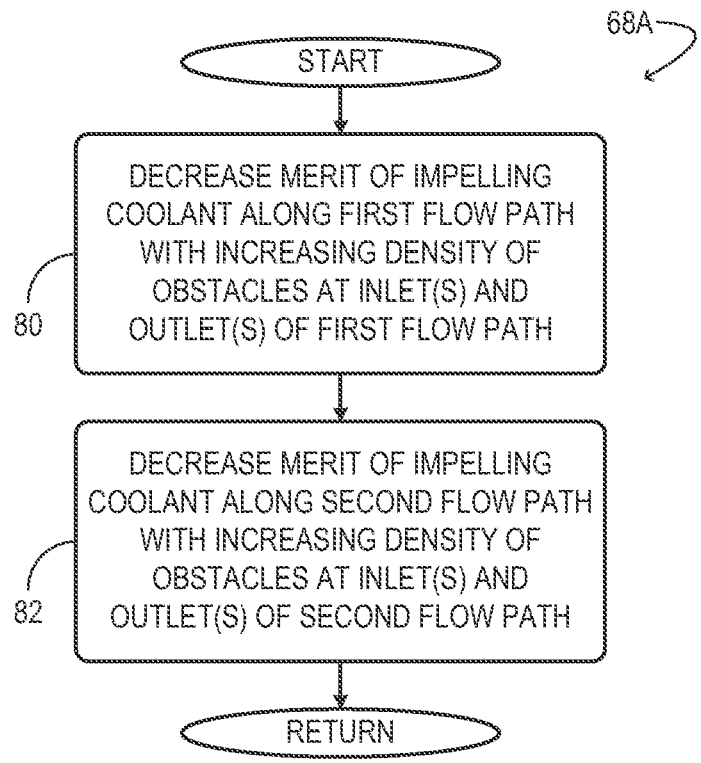
FIGS. 9 and 10 illustrate example methods for assessing the relative merit of impelling coolant along first and second flow paths, in accordance with embodiments of this disclosure.

FIG. 9 shows an example method 68A for assessing the relative merit of impelling coolant along first and second flow paths. This method may be enacted, for example, as one of the actions taken at 68 of method 64. At 80 of method 68A, the computed merit of impelling coolant along the first flow path is decreased with increasing density of obstacles sensed at the inlet and outlet vents of the first flow path. In other words, the computed merit may be greatest when a proximity detector of the electronic device senses no obstacles at the inlet or outlet vents of the first flow path. However, the computed merit may decrease—proportionately, for example—as more obstacles, larger obstacles, or a greater number of obstacles are sensed. Similarly, at 82, the computed merit of impelling coolant along the second flow path is decreased with increasing density of obstacles sensed at the inlet and outlet vents of the second flow path. From 82, method 68A the method returns.

Figure 10:
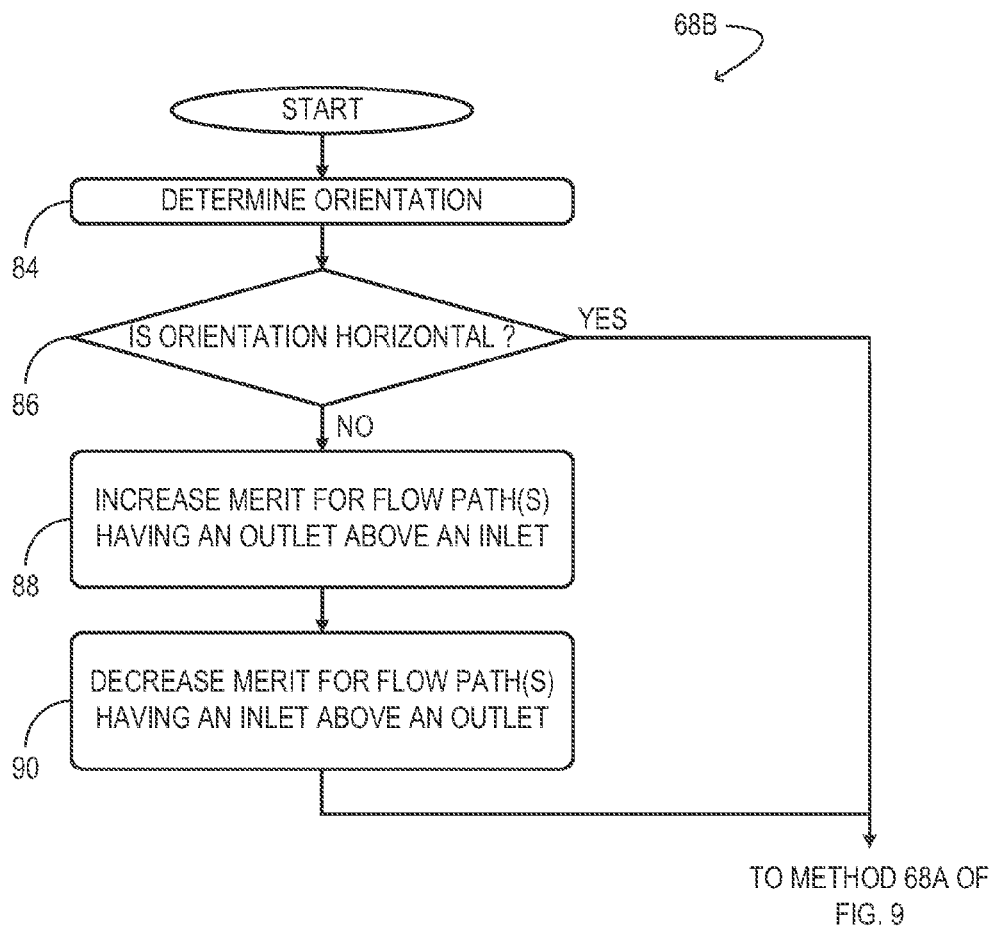

FIG. 10 shows another example method 68B for assessing the relative merit of impelling coolant along first and second flow paths. Like the previous method, this method also may be enacted as one of the actions taken at 68 of method 64. At 84 of method 68B, an orientation of the electronic device is determined. For example, an accelerometer or other inclinometer coupled within the device may sense whether the device is oriented horizontally, vertically, or obliquely, and whether it is oriented panoramically or as a portrait. At 86 it is determined whether the orientation is horizontal. If the orientation is horizontal, then execution continues with method 68A, described above. However, if the orientation of the device is not horizontal, then the method advances to 88. At 88 the computed merit is increased for any flow paths having an outlet vent positioned above an inlet vent. At 90 the computed merit is decreased for any flow paths having an inlet vent positioned above an outlet vent. From this point, execution continues with method 68A, described above.

As noted above, the methods and functions described herein may be enacted via an electronic control system 20 (shown schematically as 20A, 20B, etc.). Through operative coupling of logic subsystem 22 and memory subsystem 24, the electronic control system may be configured to enact any method—i.e., computation, processing, or control function—described herein.

More specifically, memory subsystem 24 may hold instructions that cause logic subsystem 22 to enact the various methods. To this end, the logic subsystem may include one or more physical devices configured to execute instructions. For example, the logic subsystem may be configured to execute instructions that are part of one or more programs, routines, objects, components, data structures, or other logical constructs. Such instructions may be implemented to perform a task, implement a data type, transform the state of one or more devices, or otherwise arrive at a desired result. The logic subsystem may include one or more processors configured to execute software instructions. Additionally or alternatively, the logic subsystem may include one or more hardware or firmware logic machines configured to execute hardware or firmware instructions. The logic subsystem may optionally include components distributed among two or more devices, which may be remotely located in some embodiments.

Memory subsystem 24 may include one or more physical, non-transitory, devices configured to hold data and/or instructions executable by logic subsystem 22 to implement the methods and functions described herein. When such methods and functions are implemented, the state of the memory subsystem may be transformed (e.g., to hold different data). The memory subsystem may include removable media and/or built-in devices. The memory subsystem may include optical memory devices, semiconductor memory devices, and/or magnetic memory devices, among others. The memory subsystem may include devices with one or more of the following characteristics: volatile, nonvolatile, dynamic, static, read/write, read-only, random access, sequential access, location addressable, file addressable, and content addressable. In one embodiment, the logic subsystem and the memory subsystem may be integrated into one or more common devices, such as an application-specific integrated circuit (ASIC) or so-called system-on-a-chip. In another embodiment, the memory subsystem may include electronic control-system readable removable media, which may be used to store and/or transfer data and/or instructions executable to implement the herein-described methods and processes.

The terms 'module' and/or 'engine' are used to describe an aspect of electronic control system 20 that is implemented to perform one or more particular functions. In some cases, such a module or engine may be instantiated via logic subsystem 22 executing instructions held by memory subsystem 24. It will be understood that different modules and/or engines may be instantiated from the same application, code block, object, routine, and/or function. Likewise, the same module and/or engine may be instantiated by different applications, code blocks, objects, routines, and/or functions in some cases.

Electronic control system 20 may include components of a user interface—an input subsystem and various output devices, such as a display. The display may provide a visual representation of data held by memory subsystem 24. As the herein-described methods and processes change the data held by the memory subsystem, and thus transform the state of the memory subsystem, the state of the display may likewise be transformed to visually represent changes in the underlying data. The display may include one or more display devices utilizing virtually any type of technology. Such display devices may be combined with logic subsystem 22 and/or memory subsystem 24 in a shared enclosure, or such display devices may be peripheral display devices.

Finally, it will be understood that the articles, systems, and methods described hereinabove are embodiments of this disclosure—non-limiting examples for which numerous variations and extensions are contemplated as well. Accordingly, this disclosure includes all novel and non-obvious combinations and sub-combinations of the articles, systems, and methods disclosed herein, as well as any and all equivalents thereof.

The invention claimed is:

1. A method for cooling an electronic device having first and second flow paths for transmitting a coolant, the first flow path including an inlet vent and an outlet vent, the method comprising:
  assessing a merit of impelling the coolant along the first flow path relative to impelling the coolant along the second flow path, including computing a lower relative merit when a buoyancy of the coolant opposes a flow of the coolant along the first flow path;
  when the relative merit is above a threshold, impelling the coolant along the first flow path; and
  when the relative merit is below the threshold, impelling the coolant along the second flow path.

2. The method of claim 1, wherein assessing the relative merit comprises computing a lower relative merit when the inlet or outlet vent is obstructed.

3. The method of claim 1, wherein assessing the relative merit comprises receiving an output of a sensor coupled in the electronic device.

4. A method for cooling an electronic device having a sensor and first and second flow paths for transmitting a coolant, the first flow path including a first inlet vent and a first outlet vent, the second flow path including a second inlet vent and a second outlet vent, the method comprising:
  receiving an output of the sensor that distinguishes an orientation of the device;
  correlating the orientation of the device to a merit of impelling the coolant along the first flow path relative to impelling the coolant along the second flow path;
  when the relative merit is above a threshold, impelling the coolant along the first flow path; and
  when the relative merit is below the threshold, impelling the coolant along the second flow path.

5. The method of claim 4, wherein assessing the relative merit comprises computing a lower relative merit when a user of the electronic device is opposite the first outlet vent.

6. The method of claim 4, wherein impelling the coolant along the first flow path comprises forwardly actuating a first flow controller coupled fluidically between the first inlet vent and the first outlet vent.

7. The method of claim 6, wherein impelling the coolant along the second flow path comprises reversedly actuating the first flow controller.

8. The method of claim 6, wherein impelling the coolant along the second flow path comprises actuating a second flow controller fluidically coupled in the second flow path, and wherein the second flow controller is fluidically coupled to an inlet vent different than the first inlet vent or to an outlet vent different than the first outlet vent.

9. The method of claim 4 further comprising reducing power to a heater coupled fluidically between the first inlet vent and the first outlet vent when the relative merit is below the threshold.

10. The method of claim 4 further comprising prompting a user of the electronic device to lessen a resistance to coolant flow into the inlet vent or out of the outlet vent when the relative merit is below the threshold.

11. The method of claim 4, wherein the coolant is ambient air.

12. The method of claim 4, wherein the sensor comprises one or more of a temperature sensor, an air pressure sensor, a proximity sensor, and a contact sensor.

13. The method of claim 4, wherein correlating the orientation to the relative merit comprises computing a greater relative merit when the first inlet vent is below the first outlet vent , but the second inlet vent is not below the second outlet vent.

14. An electronic device comprising:
  first and second flow paths for transmitting a coolant, the first flow path including an inlet vent for admitting the coolant and an outlet vent for discharging the coolant;
  one or more flow controllers coupled fluidically in the first and second flow paths;
  a sensor furnishing an output;
  a communications link to a network, through which one or more of a local ambient condition and a proximity to an obstacle is discoverable based on the output of the sensor; and
  an electronic control system operatively coupled to the sensor and to the one or more flow controllers and configured:
  to assess a merit of impelling the coolant along the first flow path relative to impelling the coolant along the second flow path based on the output of the sensor;
  to cause the one or more flow controllers to impel the coolant along the first flow path when the relative merit is above a threshold; and
  to cause the one or more flow controllers to impel the coolant along the second flow path when the relative merit is below the threshold.

15. The electronic device of claim 14, wherein the one or more flow controllers include a fan or pump.

16. The electronic device of claim 14, wherein the one or more flow controllers include an electrically actuable vent, baffle, or iris.

17. The electronic device of claim 14, wherein the sensor comprises a global positioning system.

18. The electronic device of claim 14, wherein the electronic device is a handheld electronic device of a user, and wherein the relative merit is lower when a user's hand is blocking the inlet vent or the outlet vent.

* * * * *